(12) United States Patent
Deng et al.

(10) Patent No.: US 6,512,377 B1
(45) Date of Patent: Jan. 28, 2003

(54) METHOD AND APPARATUS FOR EXTRACTION OF VIA PARASITICS

(75) Inventors: Shuhui Deng, Nepean (CA); Stephen S Brazeau, Nepean (CA); Xiao-Ding Cai, Fremont, CA (US)

(73) Assignee: Nortel Networks Limited, Quebec (CA)

( * ) Notice: Subject to any disclaimer, the term of this patent is extended or adjusted under 35 U.S.C. 154(b) by 8 days.

(21) Appl. No.: 09/893,747

(22) Filed: Jun. 29, 2001

(51) Int. Cl.[7] .......................... G01R 31/11; G01R 31/08
(52) U.S. Cl. ................... 324/533; 324/535; 324/534; 324/642
(58) Field of Search ................... 324/533, 535, 324/534, 642

(56) References Cited

PUBLICATIONS

Kok, P.A. De Zutter, D., Least–square estimation of the equivalent circuit parameters of a via–hole from a TDR refelectogram, including on–board rise time and delay estimation, May 1993, Components, Hybrids, and Manufacturing Technology, vol. 16, Issue 3.*

Dascher, David J. "Measuring Parasitic Capacitance and Inductance Using TDR", Hewlett–Packard Journal, Apr. 1996, Article 11.

* cited by examiner

Primary Examiner—Christine K. Oda
Assistant Examiner—Amy He
(74) Attorney, Agent, or Firm—Sughrue Mion, PLLC

(57) ABSTRACT

The present invention relates to a via parasitics testing and extracting method for Gigabit multi-layered PCB boards. The method of the present invention is a unique test and extraction process that utilizes a TDR measurement and processes the output data therefrom externally. The testing aspect involves obtaining a TDR module waveform and obtaining a text file with output data, whereas the extraction aspect involves analysis of the data in the text file. This method can be used directly to ascertain a Gigabit via structure without the limitations that are imposed by the conventional methods discussed above, and has been theoretically proven to be highly accurate and much faster than any of the existing methods. The method of the present invention has the potential to be included as a built-in testing feature in high-speed TDR meters, and may also be used in order to design an optimized via.

20 Claims, 4 Drawing Sheets

METHOD AND APPARATUS FOR EXTRACTION OF VIA PARASITICS

FIELD OF INVENTION

The present invention relates to multi-layered printed circuit boards and to the testing of vias therein.

BACKGROUND OF THE INVENTION

A via is a vertical plated hole, usually drilled, in a multi-layer printed circuit board (PCB), used to provide electrical connection between two or more layers in the PCB. If the via connects two or more layers within the PCB, not including either outer layer, it is called a buried via. If the via connects two or more layers to include one of the outer layers, it is called a blind via (blind top via or blind bottom via). If a via connects all layers, it is called a through via. The term "via" as employed herein, will be used to describe all types of vias, as described above.

The via, as an essential element of any high-speed PCB, has its own associated electrical parasitics including inductance and capacitance. Parasitics are inherent properties of a real component that cause its operation to deviate from that of an ideal component. Via parasitics directly affect system specifications and play an important role in the degradation of high-speed signals, especially signals at multi-Gigabit rates. In order to investigate overall system performance, via parasitics need to be extracted and used in system analyses.

Testing and extracting information regarding these parasitics have become indispensable tasks in designing multi-Gigabit high-speed fiber optic products. Engineers have treated these tasks as the bottleneck of Gigabit signal flow on a PCB. Without a thorough understanding and quantitative knowledge of the high-speed via, it would be difficult to successfully design the next generation of fiber optic products.

Prior art methods for via parasitics extraction may be divided into three categories: Experimental Methods; Simulation Methods; and Theoretical Methods.

Experimental Methods utilize a Time Domain Reflectometer (TDR) scope with built-in extraction capabilities. The built-in TDR extraction capability has, however, been proved to be inaccurate when the via structure being considered is of the type to be applied to Gigabit applications.

Simulation Methods utilize a 3-dimensional field solver to construct the via structure and extract the parasitics which then have to be verified by TDR measurement. The simulation process is thus lengthy and prone to produce unreliable results. Experimental verification is also needed to assess the results.

Theoretical Methods utilize 3-D electromagnetic (EM) theory, in order to solve for a particular via structure, which has an analytic solution. Such theoretical solutions, however, cannot be applied to the practical via structures that are used for Gigabit applications.

A further method has been disclosed in David J. Dascher, "Measuring Parasitic Capacitance and Inductance Using TDR", Hewlett-Packard Journal, April 1996, which attempts to overcome some of the drawbacks of these prior art methods. Dascher discloses a method of using TDR to measure any discontinuity in transmission line systems very accurately. However, the method in Dascher has some limitations associated therewith. For instance, for the Dascher method to be accurate: (1) the via structure being considered must be either primarily capacitive or primarily inductive, since the structure is to be modeled by a single element; and (2) the two transmission lines connected to the via being considered must be lossless. These restrictions exclude situations that are commonly encountered with vias used in emerging Gigabit applications. Moreover, in light of further investigation, some of the conclusions that were reached in the Dascher publication appear to be incorrect, which further limits the application of the method disclosed therein.

Therefore, there is a need for a method of testing via parasitics, and a method of extracting such information, which will overcome at least one of the drawbacks of the prior art.

SUMMARY OF THE INVENTION

The method of the present invention is a unique test and extraction process that utilizes a TDR measurement and processes the output data therefrom externally at a computing means, such as a computer running a suitable computer program. The testing aspect involves obtaining a TDR module waveform and obtaining a text file with output data, whereas the extraction aspect involves analysis of the data in the text file. This method can be used directly to ascertain a Gigabit via structure without the limitations that are imposed by the conventional methods discussed above. The invented method has been theoretically proven to be highly accurate. The speed of the test and extraction process is practically much faster than any of the existing methods. One main advantage is the method's direct applicability to high-speed Gigabit fiber optic products.

According to an aspect of the present invention, there is provided a method of extracting via parasitics comprising the steps of: measuring, at a measuring means, a measured time domain reflectometer (TDR) waveform characterizing said via; computing, at a computing means, an analytic TDR waveform characterizing said via; comparing, at a comparing means, said measured TDR waveform and said analytic TDR waveform and outputting a comparison result; and extracting via parasitics from said comparison result.

According to another aspect of the present invention, there is provided an apparatus for extracting via parasitics comprising: measuring means for obtaining a time domain reflectometer (TDR) waveform characterizing said via; computing means for computing an analytic TDR waveform characterizing said via; comparing means for comparing said measured TDR waveform and said analytic TDR waveform and outputting a comparison result; and extracting means for extracting via parasitics from said comparison result.

According to a further aspect of the present invention, there is provided a method of designing a via according to an embodiment of the present invention comprises the steps of: a) computing, at a computing means, a first time domain reflectometer (TDR) waveform of a proposed via design, said first TDR waveform being obtained by analytic or numerical method calculations; b) comparing, at a comparing means, said first TDR waveform with a second TDR waveform having desired characteristics for said via and outputting a comparison result; c) verifying whether a variation between said first TDR waveform and said second TDR waveform is outside a defined tolerance; d) if necessary, repeating steps a) and b) until step c) produces a variation that is within said defined tolerance; and e) extracting via parasitics from said comparison result in order to design the via therefrom.

The method of the present invention is advantageous in that it is accurate and applicable to Gigabit via structures, a feature that was not present with prior art Experimental Methods. The method of the present invention, while remaining accurate, is able to produce results much faster than prior art Simulation Methods. In comparison with Theoretical Methods, the method of the present invention can be applied to practical via structures that are used for Gigabit applications.

The method of the present invention is also an improvement over the method in the Dascher publication in that it is applicable to via structures with both capacitive and inductive effects, a situation which is commonly encountered in Gigabit applications nowadays.

Although the method of the present invention is most effective for multi-Gigabit applications, such as OC-768 (2.5 Gb/s) or its next generation, since transmission lines used in such applications always have losses, the method is still effective for other applications, such as OC-192 (625 Mb/s) applications where losses must be considered.

Methods according to the present invention may be applied to any degree of complexity of the practical via structure scheme, including the presence of other nearby ground/signal vias as well as any non-trivial interconnects with sufficient efficiency and accuracy. Additionally, the results of the method of the present invention can be flexibly adapted to circuit requirements according to the physical characteristics of the Gigabit board. This flexible adaptation is a consequence of the fact that obtaining the TDR waveform automatically includes all complex factors associated with the circuit or the board, since both inductive and capacitive characteristics are considered. As such, the model does not need to be changed depending upon the complexity of the board itself, and it is not necessary to know the details of all the complex factors associated therewith in order to extract accurate via parasitics.

BRIEF DESCRIPTION OF THE DRAWINGS

Embodiments of the present invention will be further described with reference to the accompanying drawings in which.

DETAILED DESCRIPTION OF THE INVENTION

Via Models Setup

Usually, a via is connected to lossy transmission lines on both sides by pads. The measured losses of a lossy transmission line typically include the conductor loss and dielectric loss. The actual value of a via's capacitance may be affected by the following elements: the via pads, barrels, and traces (excess capacitance). Although pads are used for mechanical stability, their presence affects via parasitics. In real-world applications, there may be even more factors to be considered, such as a situation where there are other vias and traces nearby.

However, no matter how complex the real-world situation, a via can be approximately and conveniently modeled by any of the following structures: C-L-C π-shape structure; L-C-L T-shape structure; C-L structure; L-C structure; single C structure; and single L structure. These model structures are shown in FIGS. 1A–1F, respectively.

The π-shape structure is the most common structure for high-speed circuits. In fact, the single C, L, C-L, and L-C structures are all special cases of the π-shape structure. Although the π-shape structure is most useful with the present invention, the T-shape structure can also be used, since it too considers inductance and capacitance in a sufficient manner. In a preferred embodiment of the present invention, the method includes the extraction of data based on both the π-shape and T-shape structures and verification of which curve is closest to the experimental values. As such, it is not necessary to select the model to be used before performing the testing/extraction.

Figure 1A:
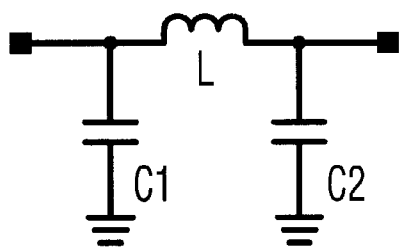
FIG. 1 illustrates circuit diagrams representing different types of via models.
Figure 1B:
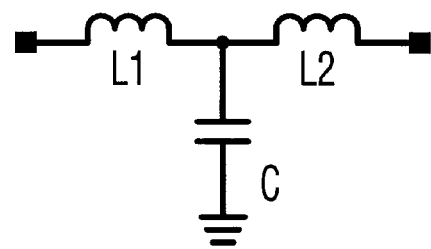
Figure 1C:
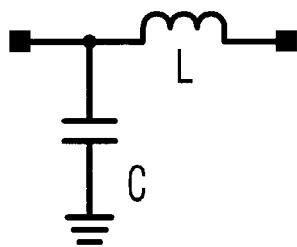
Figure 1D:
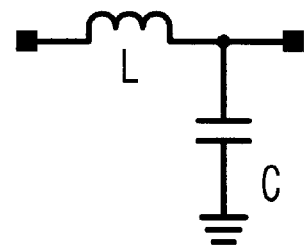
Figure 1E:
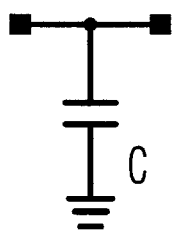
Figure 1F:
Figure 2:
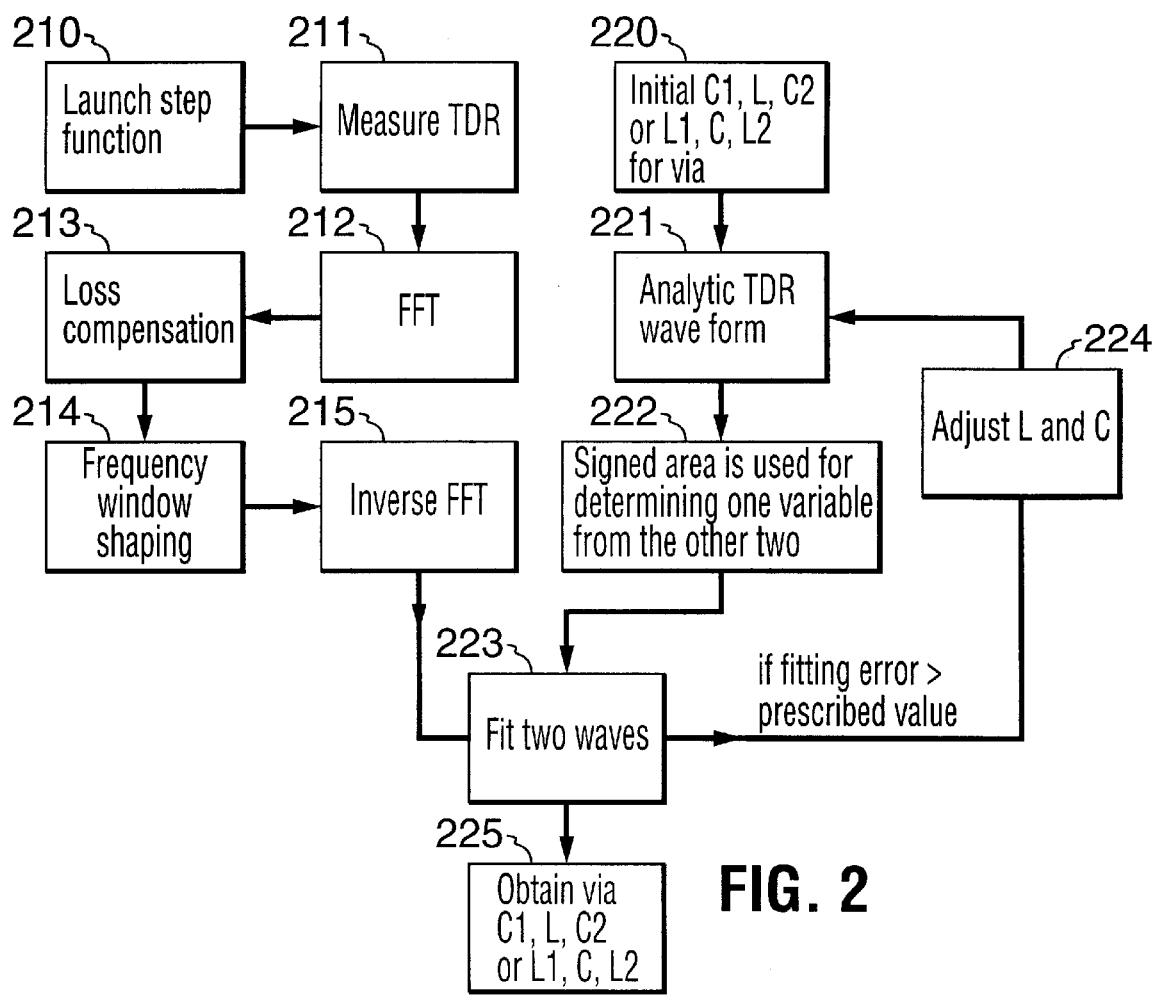
FIG. 2 is a flowchart outlining the steps of a via parasitics extraction process according to an embodiment of the present invention.

The method of the present invention includes two major steps: one is the measurement of TDR waveform (testing), and the other is theoretical analysis and extraction. In situations where both the via capacitance and inductance are needed (such as in the C-L-C π-shape structure, or L-C-L T-shape structure, where C is shunt capacitor and L is series inductor) these values are extracted simultaneously by analyzing the measured TDR waveform. Therefore, the method of the present invention presents a general method of determining a value of a discontinuity by comparing measured and analytic values. The overall extraction process is shown in FIG. 2.

In step 210, a step function is launched. Then, in step 211, a measuring means is used to obtain the TDR waveform. In a preferred embodiment, the measuring means comprises a high-speed TDR module and a digital oscilloscope. The following measurements of the launched step waveform may be read from the measuring means: amplitude (DV), rise time (tr), time sampling step (tstep_exp).

In a preferred embodiment, a coaxial cable is used to connect a launch port of the measuring means to the test board comprising the via being tested by means of a Surface Mounted Assembly (SMA) or another type of connector.

Advantageously, the TDR data may be output as a text file including discretized time and voltages.

The parts of the measured TDR data relevant to the via are then used. This relevant data may comprise several tens of points, or it may only comprise a few points. In the case where only a few points are available, interpolation may be applied.

It is important to note that the via capacitance and inductance values cannot be ascertained directly from the via TDR waveform itself. The waveform contains the C and L information, however such information must be extracted.

For the purpose of performing compensation, the major parameters of cable and traces connected to the via are needed. The parameters of a cable that are needed are its length (l_coax), loss per length versus frequency, and characteristic impedance. The parameters of a trace needed are the length (l_trace) from via to connector, loss per length versus frequency, and characteristic impedance. There are three ways to determine their losses per length versus frequency, which are 1) product data sheet, 2) measurement, and 3) calculation.

For 3), the central and outer conductor radiuses of cable or the trace width & ground-to-ground spacing of transmission line in a board and their conductivities, their insulator relative dielectric constants and loss tangents can be used to compute their losses per length versus frequency. Then their transfer functions versus frequency can be obtained.

Regeneration of Non-attenuated TDR Waveform

The compensation method is used to regenerate a non-attenuated TDR waveform.

In step 212, the fast Fourier transformation is applied to the experimental data of the via TDR waveform. The spectrum of the via TDR waveform can then be obtained. On the other hand, in step 213, a compensated spectrum of the via TDR waveform is obtained by loss compensation. Preferably, this may be achieved by dividing the spectrum of the via TDR waveform by the total transfer function of the lossy cable and trace.

Because the loss of the very high frequency component of the spectrum is significant, the noise in the compensated spectrum of the via TDR form at very high frequency (f>2 fc) will be generated numerically, by dividing the spectrum of the via TDR by the very small total transfer function of the lossy cable and trace. In step 214, a frequency window may be used to filter out the noise of the very high frequency component of the compensated spectrum. An example for this window is $1/[1+(\text{frequency}/fc)^2]$, where fc is the half-amplitude-decay frequency.

In step 215, the compensated via TDR form can be obtained by applying the inverse fast Fourier transformation to the compensated spectrum of the via TDR form. Following step 215, the measurement, or testing, portion of the method of the present invention is complete. The analysis/extraction portion of the method will be described next.

Analytic TDR Wave

In step 220, a formula of a TDR waveform with the same frequency window as in the section above has been derived theoretically. The window smooths the TDR waveform. The TDR waveform is a function of time, via capacitance(s), via inductance(s), and trace characteristic impedance. It is used as a TDR reference library. For example, if the trace characteristic impedance is fixed, the diagrams of TDR waveform versus different C and L values (2 Cs and 1 L for π-shape structure) can be plotted. In step 221, if the window $1/[1+(\text{frequency}/fc)^2]$ in spectrum is used, the analytic TDR waveform can be derived as:

$$VTDR = \begin{vmatrix} \left[\mp\left(\frac{2\cdot\Delta V\cdot\pi\cdot fc}{tr}\right)\cdot\sum_{i=1}^{2}\sum_{j=1}^{3}D_{i,j}\right] & \text{if } t < 0 \\ \left[\mp\left(\frac{2\cdot\Delta V\cdot\pi\cdot fc}{tr}\right)\cdot\sum_{i=1}^{3}\sum_{j=1}^{3}E_{i,j}\right] & \text{if } 0 \leq t < tr \\ \left[\mp\left(\frac{2\cdot\Delta V\cdot\pi\cdot fc}{tr}\right)\cdot\sum_{i=1}^{3}\sum_{j=1}^{3}F_{i,j}\right] & \text{if } tr \leq t \end{vmatrix} \quad (1)$$

where "−" is employed for the π-shape structure, and "+" is employed for the T-shape structure.

The following equations are then used to determine the values of $D_{i,j}$, $E_{i,j}$ and $F_{i,j}$ in the equations above:

$$D_{1,j} = \frac{p_j}{(q_j)^2}\cdot e^{2\pi\cdot fc\cdot t}.$$

$$\left[\frac{1}{2\cdot\pi\cdot fc}\cdot(1-e^{-2\pi\cdot fc\cdot tr})-\frac{1}{q_j+2\cdot\pi\cdot fc}\cdot\left[1-e^{-(q_j+2\pi\cdot fc)\cdot tr}\right]\right]$$

$$D_{2,j} = \frac{p_j}{(q_j)^2}\cdot\frac{1}{q_j+2\cdot\pi\cdot fc}\cdot(1-e^{-q_j\cdot tr})\cdot e^{2\pi\cdot fc\cdot(t-tr)}$$

$$E_{1,j} = \frac{p_j}{(q_j)^2}\cdot\left[\frac{1}{2\cdot\pi\cdot fc}\cdot[1-e^{-2\pi\cdot fc\cdot(tr-t)}] - \frac{1}{q_j+2\cdot\pi\cdot fc}\cdot e^{-q_j\cdot t}\cdot\left[1-e^{-(q_j+2\pi\cdot fc)\cdot(tr-t)}\right]\right]$$

$$E_{2,j} = \frac{p_j}{(q_j)^2}\cdot\left[\frac{-1}{2\cdot\pi\cdot fc}\cdot(e^{-2\pi\cdot fc\cdot t}-1) - \frac{1}{q_j-2\cdot\pi\cdot fc}\cdot e^{-q_j\cdot t}\cdot\left[e^{(q_j-2\pi\cdot fc)\cdot t}-1\right]\right]$$

$$E_{3,j} = \frac{p_j}{(q_j)^2}\cdot\frac{1}{q_j+2\cdot\pi\cdot fc}\cdot e^{-q_j\cdot t}(e^{q_j\cdot tr}-1)e^{-(q_j+2\pi\cdot fc)\cdot(tr-t)}$$

$$F_{1,j} = \frac{p_j}{(q_j)^2}\cdot e^{-2\pi\cdot fc\cdot t}\cdot\left[\frac{-1}{2\cdot\pi\cdot fc}\cdot(1-e^{2\pi\cdot fc\cdot tr}) - \frac{1}{q_j-2\cdot\pi\cdot fc}\cdot\left[1-e^{-(q_j-2\pi\cdot fc)\cdot tr}\right]\right]$$

$$F_{2,j} = \frac{p_j}{(q_j)^2}\cdot\frac{1}{q_j+2\cdot\pi\cdot fc}\cdot e^{-q_j\cdot t}(e^{q_j\cdot tr}-1)$$

$$F_{3,j} = \frac{p_j}{(q_j)^2}\cdot\frac{1}{q_j-2\cdot\pi\cdot fc}\cdot$$

$$(e^{q_j\cdot tr}-1)\cdot\left[e^{-(q_j-2\pi\cdot fc)\cdot tr}\cdot e^{-2\pi\cdot fc\cdot t}-e^{-q_j\cdot t}\right]$$

In the above equations, the values p1, p2, p3, q1, q2, q3 are functions of C1, L, C2, Z0 or L1, C, L2, Z0. These values can be expressed as:

$$p_j = \left[\frac{a1\cdot(q_j)^2 - a2\cdot q_j + a3}{h}\right]\cdot d_j$$

$$d_1 = 1$$

$$d_2 = \frac{-(q_1-q_3)}{q_2-q_3}$$

$$d_3 = \frac{q_1-q_2}{q_2-q_3}$$

$$h = (q_1)^2 - q_1\cdot(q_2+q_3) + q_2\cdot q_3$$

where, $$q_1 = -\left(S+T-\frac{b1}{3}\right)$$

$$q_2 = -\left[\frac{-1}{2}\cdot(S+T) - \frac{1}{3}\cdot b1 + \frac{1}{2}\cdot i\cdot\sqrt{3}\cdot(S-T)\right]$$

$$q_3 = -\left[\frac{-1}{2}\cdot(S+T) - \frac{1}{3}\cdot b1 - \frac{1}{2}\cdot i\cdot\sqrt{3}\cdot(S-T)\right]$$

and where, $$S = \left(RR+\sqrt{QQ^3+RR^2}\right)^{\frac{1}{3}}$$

$$T = \left(RR-\sqrt{QQ^3+RR^2}\right)^{\frac{1}{3}}$$

$$RR = \frac{9\cdot b1\cdot b2 - 27\cdot b3 - 2\cdot(b1)^3}{54}$$

$$QQ = \frac{3\cdot b2 - (b1)^2}{9}$$

-continued

For the π-shape structure, $$a1 = \frac{1}{C1 \cdot Z0} \quad a2 = \frac{1}{C1 \cdot C2 \cdot (Z0)^2} \quad a3 = \frac{1}{L \cdot C1 \cdot C2 \cdot Z0}$$

$$b1 = \frac{C1+C2}{C1 \cdot C2 \cdot Z0} \quad b2 = \frac{(C1+C2) \cdot (Z0)^2 + L}{L \cdot C1 \cdot C2 \cdot (Z0)^2} \quad b3 = \frac{2}{L \cdot C1 \cdot C2 \cdot Z0}$$

and for the T-shape structure, $$a1 = \frac{Z0}{L1} \quad a2 = \frac{(Z0)^2}{L1 \cdot L2} \quad a3 = \frac{Z0}{C \cdot L1 \cdot L2}$$

$$b1 = \frac{(L1+L2) \cdot Z0}{L1 \cdot L2} \quad b2 = \frac{L1+L2+C \cdot (Z0)^2}{C \cdot L1 \cdot L2} \quad b3 = \frac{2 \cdot Z0}{C \cdot L1 \cdot L2}$$

As fc approaches infinity, Equation (1) becomes the TDR waveform without frequency window shaping.

The total signed TDR voltage-versus-time area, S, is derived and represented by:

$$S\_x = -2 \cdot \Delta V \cdot \sum_{j=1}^{3} \frac{p_j}{(q_j)^2} = L \cdot \frac{\Delta V}{2 \cdot Z0} - (C1+C2) \cdot \frac{\Delta V \cdot Z0}{2} \quad (2.1)$$

$$S\_T = 2 \cdot \Delta V \cdot \sum_{j=1}^{3} \frac{p_j}{(p_j)^2} = (L1+L2) \cdot \frac{\Delta V}{2 \cdot Z0} - C \cdot \frac{\Delta V \cdot Z0}{2} \quad (2.2)$$

In these equations (2.1) and (2.2), S is independent of the rise time tr and the parameter fc. If the appropriate Equation, (2.1) or (2.2), is applied to the loop in FIG. 2, the number of variables to be determined can be reduced to two (that is C1 & L, C1 & C2, L & C2, L1 & C, L1 & L2, or C & L2). This is represented in FIG. 2 by step 222, where a signed area is used for determining one variable from the other two.

Figure 3:
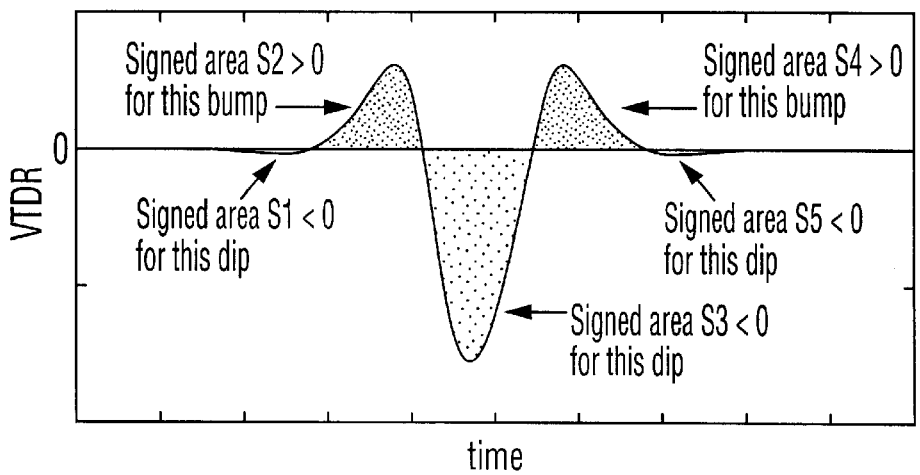
FIG. 3 illustrates an exemplary TDR waveform showing the presence of various signed areas.
Figure 5:
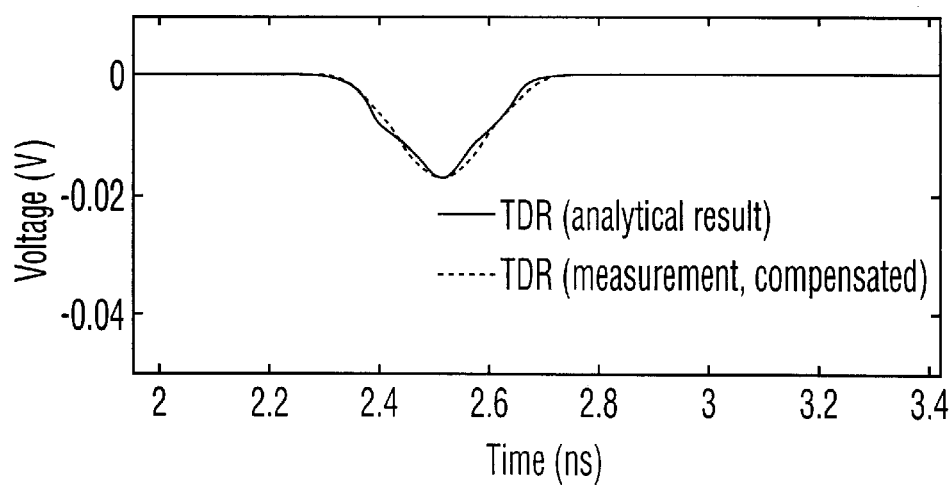
FIG. 5 illustrates a comparison between analytic and measured TDR waveforms for a measurement using the apparatus of FIG. 4.
Figure 7:
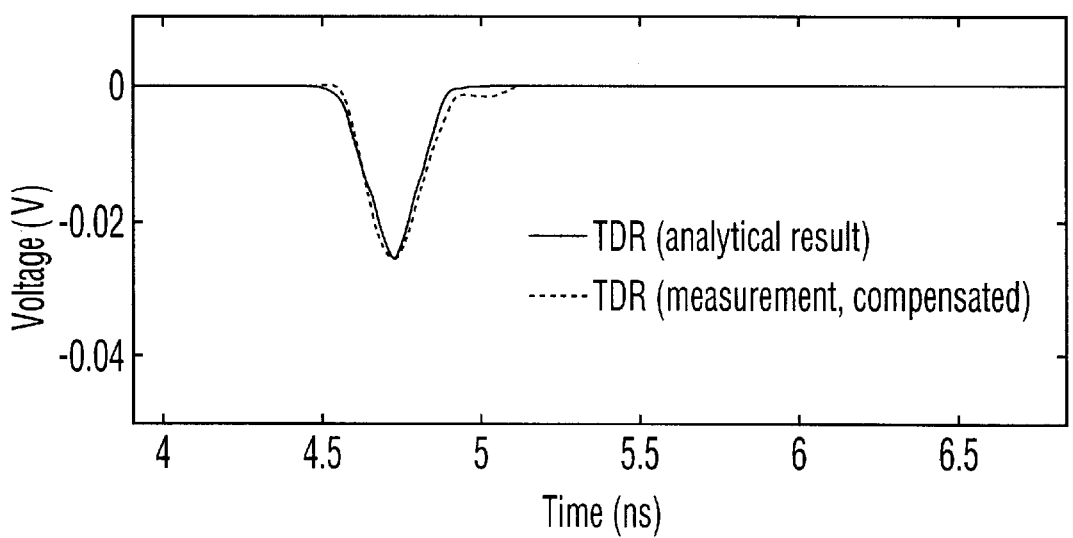
FIG. 7 illustrates a comparison between analytic and measured TDR waveforms for a measurement using the apparatus of FIG. 6.

FIG. 3 illustrates an exemplary TDR waveform showing the presence of various signed areas, where the "bumps" have positive signed area values and the "dips" have negative signed area values. The signed areas appearing in FIGS. 5 and 7 are the dips and their values are negative.

Comparison Between Measured and Analytic TDR Wave Forms

Once the measured TDR waveform and the analytic TDR waveform have been obtained, the next step is to compare, or fit, the measured and analytic waveforms, as indicated in step 223 of FIG. 2. As mentioned earlier, in a preferred embodiment of the present invention, the method includes the extraction of data based on both the π-shape and T-shape structures and verification of which curve is closest to the experimental values. However, the method comprising extraction based on one structure still accomplishes the object of the present invention, along with many advantages associated therewith.

The measured TDR waveform may be different from the analytic TDR waveform in the time reference. In order to compare the measured TDR waveform and the analytic TDR waveform, a collocation process must be performed. An automatic collocation method has been developed for this purpose.

The geometric center of the measured via TDR waveform can readily be determined; the time center (t_center1) is defined by the time coordinate of the geometric center. The geometric center of the analytic via TDR waveform can also be determined, with the time center (t_center2) also being defined by the time coordinate of its geometric center. The time difference between t_center1 and t_center2 is now available. The analytic TDR waveform is then moved, parallel to the time axis, a distance equal to the time difference. By keeping the same length of time lapse, the collocation can be performed.

The total signed TDR waveform area S (if TDR waveform voltage V>0, incremental area dS>0; if V<0, dS<0) is determined by the via capacitance and inductance. The analytical formula (2.1) or (2.2) is preferably used in computer code that performs the extraction, for speeding up the automatic extraction. This analytic formula can be used if transmission lines with the same characteristic impedance are connected on either side of the via. However, in few cases, the characteristic impedances of two transmission lines connected to the via are not equal to each other. In such cases, this analytic formula cannot be applied to speed up the automatic extraction. The partial match to the TDR peak value and shape, however, can be used for performing the extraction for both automatic and manual extractions.

The L and C values in the analytic TDR waveform may be adjusted in order to improve the correlation between the measured and analytic TDR waveform. As shown in step 224 of FIG. 2, if the two waves are different from each other beyond a prescribed tolerance range, i.e. a fitting error is greater than a prescribed value, the values of L and C are adjusted and the variables are recalculated. The adjustment of L and C values and further comparison of analytic and measured TDR waveforms may be continued in a loop, as shown in FIG. 2, until a suitable difference or variation between the two waveforms has been achieved. A root mean square method may be used to determine the difference between the waveforms. The prescribed value may be a preset default value, or may be a user-defined value based on the user's specific requirements.

Once the "fitting" step 223 has been completed and the fitting error is within the defined tolerance, the via parasitics (C1, L, C2; or L1, C, L2) may be obtained. When the values of capacitance and inductance have been changed such that the minimum deviation has been achieved, the loop in step 224 is then terminated and the values of capacitance and inductance are obtained automatically by software, in step 225, using the equations as described above.

EXTRACTION EXAMPLES

Example 1

A High-speed Backplane via

Figure 4:
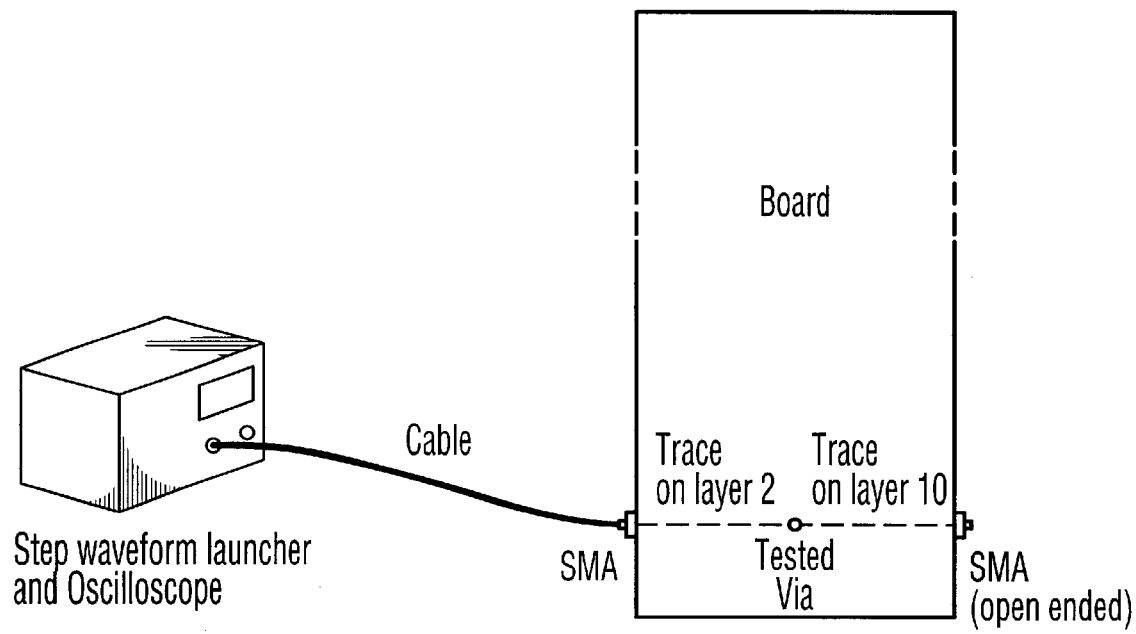
FIG. 4 illustrates an apparatus for via parasitics measurement according to a first exemplary embodiment of the present invention.

FIG. 4 illustrates an apparatus for via parasitics measurement according to a first exemplary embodiment of the present invention. In this example, parasitics for a tested via in a backplane (board) are extracted using an arrangement as shown in FIG. 4. In this case, the via is modeled by a π-shape CLC circuit. FIG. 5 shows the comparison between analytic and measured TDR wave forms after the compensation, where left and right reference levels are averaged and normalized to zero.

In this example, the launching-step-function rise time is 156 ps and voltage amplitude is 0.2V. The cable length is 49 cm, the central and outer conductor diameters are 0.3 mm & 1.092 mm, respectively, and their conductivities are $5.76 \times 10^7$ S/m, the insulator relative dielectric constant is 2.4 and loss tangent is 0.002. The trace (strip line) length in the board from the first SMA to the via is 12.5 cm, the trace width is 7 mil, the thickness is 0.7 mil & ground-to-ground spacing is 17.6 mil and their conductivities are $5.76 \times 10^7$ S/m, the insulator relative dielectric constant is 3.8 and loss tangent is 0.018 (GeTek). The fc is 5 GHz. Taking into account all of the above information relating to this first example, for the first shunt capacitor, its extracted capacitance C1=0.59 pF, for the series inductor, its extracted inductance L=1.63 nH, and for the second capacitor, its extracted capacitance C2=0.63 pF.

Example 2

A High-speed Connector via

Figure 6:
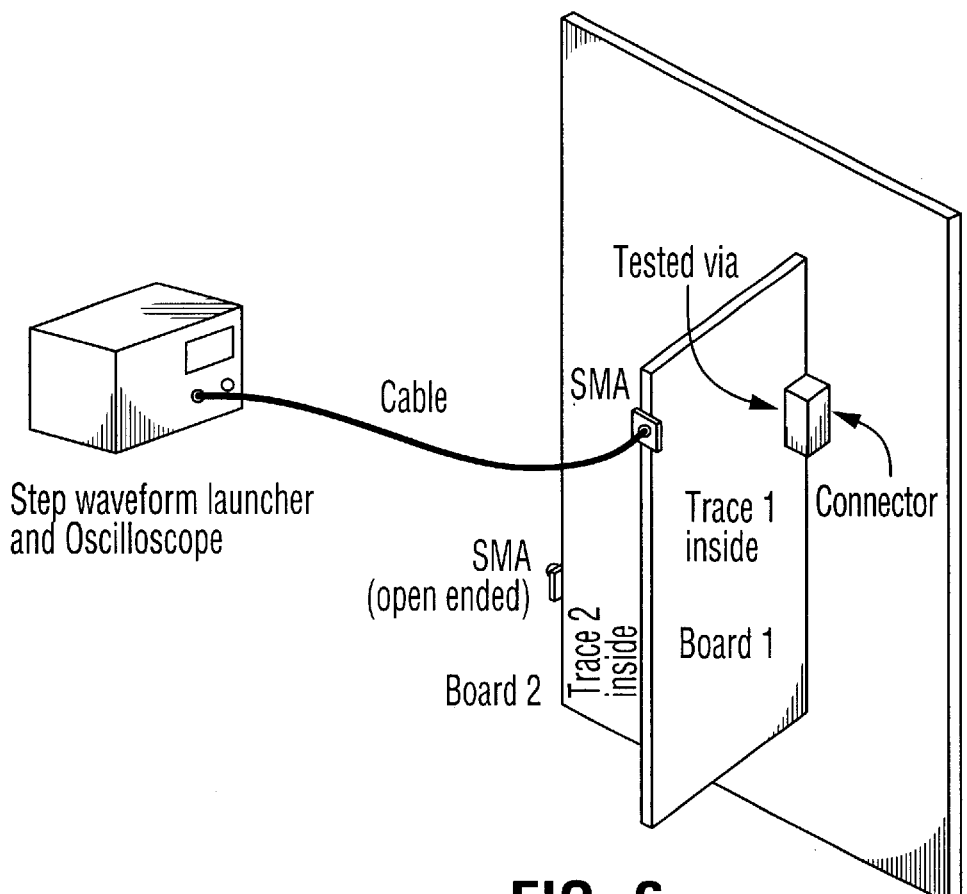
FIG. 6 illustrates an apparatus for via parasitics measurement according to a second exemplary embodiment of the present invention.

FIG. 6 illustrates an apparatus for via parasitics measurement according to a second exemplary embodiment of the present invention. Parasitics for the tested via are extracted using an arrangement as shown in FIG. 6. In this case, the via is once again modeled by π-shape CLC circuit. FIG. 7 shows the comparison between analytic and measured TDR wave forms after the compensation, where left and right reference levels are averaged and normalized to zero. It is interesting to note that one dip was analyzed, which represents the via on one side of the connector.

In this second example, the launching-step-function rise time is 156 ps and voltage amplitude is 0.2V. The cable length is 100 cm, the central and outer conductor diameters are 2.4 mm & 1.092 mm, respectively, and their conductivities are $5.76*10^7$ S/m, the insulator relative dielectric constant is 2.4 and loss tangent is 0.002. The trace (strip line) length in the board from the first SMA to the via is 14 cm, the trace width is 4 mil, the thickness is 0.7 mil & ground-to-ground spacing is 11 mil and their conductivities are $5.76*10^7$ S/m, the insulator relative dielectric constant is 3.8 and loss tangent is 0.018 (GeTek). The fc is 5 GHz. Taking into account all of the above information relating to this first example, for the first shunt capacitor, its extracted capacitance C1=0.7 pF, for the series inductor, its extracted inductance L=1.5 nH, and for the second capacitor, its extracted capacitance C2=0.8 pF.

The method of the present invention has the potential to be included as a built-in testing feature in any of the high-speed TDR meters that have been sold worldwide, and there are imminent requirements for this purpose. Therefore, equipment that is provided with means to perform the steps in the method of the present invention would satisfy this need.

Although the prescribed testing and extraction method has been described in relation to the high speed PCB area, it has a much broader application perspective. For instance, the method of the present invention can be applied to ASIC packaging, high speed backplane, microwave modules, and any other areas where high speed vias are an essential element.

The method of the present invention is useful beyond being a method of testing and extracting. Steps of this method may be employed as a method of designing a via that is able to satisfy criteria that were not obtainable using prior art design methods.

In particular, a method of designing a via according to an embodiment of the present invention comprises the steps of: a) computing, at a computing means, a first time domain reflectometer (TDR) waveform of a proposed via design, said first TDR waveform being obtained by analytic or numerical method calculations; b) comparing, at a comparing means, said first TDR waveform with a second TDR waveform having desired characteristics for said via and outputting a comparison result; c) verifying whether a variation between said first TDR waveform and said second TDR waveform is outside a defined tolerance; d) if necessary, repeating steps a) and b) until step c) produces a variation that is within said defined tolerance; and e) extracting via parasitics from said comparison result in order to design the via therefrom.

Advantageously, the first TDR waveform described above may be obtained based on a set of equations characterizing said parasitics. This set of equations may be the set of equations for an analytic TDR, as outlined earlier.

If steps in the method as described above are employed before a via is constructed, with desired values being used, it is possible to obtain an optimized via design before having to construct and test it. This optimized via design may include optimizing such parameters as via pad size, barrel size, and anti-pad clearance. In fact, Gigabit fiber optic products that are designed using the method of the present invention have unprecedented design accuracy that is necessary to achieve the design target to meet the requirements of the high capacity long haul fiber transport market. The optimized via structure has been Implemented in the most advanced fiber optics products within Nortel's OPTera™ Long Haul Product family.

What is claimed is:

1. A method of extracting via parasitics comprising the steps of:

a) measuring, at a measuring means, a measured time domain reflectometer (TDR) waveform characterizing said via;

b) computing, at a computing means, an analytic TDR waveform characterizing said via;

c) comparing, at a comparing means, said measured TDR waveform and said analytic TDR waveform and outputting a comparison result; and d) extracting via parasitics from said comparison result.

2. A method according to claim 1 further comprising the steps of:

c1) verifying, from said comparison result, whether a variation between said measured TDR and said analytic TDR is within or outside a defined tolerance; and c2) repeating steps b) and c) when step c) produces a variation that is outside said defined tolerance.

3. A method according to claim 1 wherein step a) further comprises:

regenerating a non-attenuated TDR waveform.

4. A method according to claim 3 wherein said step of regenerating comprises:

performing loss compensation calculation and frequency window shaping on said measured TDR waveform.

5. A method according to claim 1 wherein:

step a) comprises measuring a plurality of TDR waveforms based on a plurality of via models; and step c) comprises comparing one of said measured TDR waveforms that is closest to said analytic TDR waveform with said analytic TDR waveform.

6. A method according to claim 1 wherein said step of comparing comprises carrying out an automatic collocation method.

7. A method according to claim 1 further comprising the step of:

a1) outputting data relating to said measured TDR waveform to an output file.

8. A method according to claim 7 further comprising the step of:

b1) analyzing said outputted data in order to obtain said analytic TDR waveform.

9. A method according to claim 8 wherein said step of analyzing is performed based on a set of equations characterizing said parasitics.

10. A method according to claim 9 wherein said set of equations comprises:

$$VTDR = \begin{cases} \left|\left[\mp\left(\frac{2\cdot\Delta V\cdot\pi\cdot fc}{tr}\right)\cdot\sum_{i=1}^{2}\sum_{j=1}^{3}D_{i,j}\right]\right| & \text{if } t<0 \\ \left|\left[\mp\left(\frac{2\cdot\Delta V\cdot\pi\cdot fc}{tr}\right)\cdot\sum_{i=1}^{3}\sum_{j=1}^{3}E_{i,j}\right]\right| & \text{if } 0\le t<tr \\ \left|\left[\mp\left(\frac{2\cdot\Delta V\cdot\pi\cdot fc}{tr}\right)\cdot\sum_{i=1}^{3}\sum_{j=1}^{3}F_{i,j}\right]\right| & \text{if } tr\le t \end{cases}$$

where "−" is employed for the π-shape structure, and "+" is employed for the T-shape structure, and the values of $D_{i,j}$, $E_{i,j}$ and $F_{i,j}$ in the equations above being defined by:

$$D_{1,j} = \frac{p_j}{(q_j)^2}\cdot e^{2\cdot\pi\cdot fc\cdot t}\cdot$$

$$\left[\frac{1}{2\cdot\pi\cdot fc}\cdot(1-e^{-2\cdot\pi\cdot fc\cdot tr}) - \frac{1}{q_j+2\cdot\pi\cdot fc}\cdot\left[1-e^{-(q_j+2\cdot\pi\cdot fc)\cdot tr}\right]\right]$$

$$D_{2,j} = \frac{p_j}{(q_j)^2}\cdot\frac{1}{q_j+2\cdot\pi\cdot fc}\cdot(1-e^{-q_j\cdot tr})\cdot e^{2\cdot\pi\cdot fc\cdot(t-tr)}$$

$$E_{1,j} = \frac{p_j}{(q_j)^2}\cdot\left[\frac{1}{2\cdot\pi\cdot fc}\cdot[1-e^{-2\cdot\pi\cdot fc\cdot(tr-t)}] - \frac{1}{q_j+2\cdot\pi\cdot fc}\cdot e^{-q_j\cdot t}\cdot\left[1-e^{-(q_j+2\cdot\pi\cdot fc)\cdot(tr-t)}\right]\right]$$

$$E_{2,j} = \frac{p_j}{(q_j)^2}\cdot\left[\frac{-1}{2\cdot\pi\cdot fc}\cdot(e^{-2\cdot\pi\cdot fc\cdot t}-1) - \frac{1}{q_j-2\cdot\pi\cdot fc}\cdot e^{-q_j\cdot t}\cdot\left[e^{(q_j-2\cdot\pi\cdot fc)\cdot t}-1\right]\right]$$

$$E_{3,j} = \frac{p_j}{(q_j)^2}\cdot\frac{1}{q_j+2\cdot\pi\cdot fc}\cdot e^{-q_j\cdot t}(e^{q_j\cdot tr}-1)e^{-(q_j+2\cdot\pi\cdot fc)\cdot(tr-t)}$$

$$F_{1,j} = \frac{p_j}{(q_j)^2}\cdot e^{-2\cdot\pi\cdot fc\cdot t}\cdot\left[\frac{-1}{2\cdot\pi\cdot fc}\cdot(1-e^{2\cdot\pi\cdot fc\cdot tr}) - \frac{1}{q_j-2\cdot\pi\cdot fc}\cdot\left[1-e^{-(q_j-2\cdot\pi\cdot fc)\cdot tr}\right]\right]$$

$$F_{2,j} = \frac{p_j}{(q_j)^2}\cdot\frac{1}{q_j+2\cdot\pi\cdot fc}\cdot e^{-q_j\cdot t}(e^{q_j\cdot tr}-1)$$

$$F_{3,j} = \frac{p_j}{(q_j)^2}\cdot\frac{1}{q_j-2\cdot\pi\cdot fc}\cdot$$

$$(e^{q_j\cdot tr}-1)\cdot\left[e^{-(q_j-2\cdot\pi\cdot fc)\cdot tr}\cdot e^{-2\cdot\pi\cdot fc\cdot t}-e^{-q_j\cdot t}\right]$$

where the values p1, p2, p3, q1, q2, q3 are functions of C1, L, C2, Z0 or L1, C, L2, Z0, which may be expressed as:

$$p_j = \left[\frac{a1\cdot(q_j)^2 - a2\cdot q_j + a3}{h}\right]\cdot d_j$$

$$d_1 = 1$$

$$d_2 = \frac{-(q_1-q_3)}{q_2-q_3}$$

$$d_3 = \frac{q_1-q_2}{q_2-q_3}$$

$$h = (q_1)^2 - q_1\cdot(q_2+q_3) + q_2\cdot q_3$$

where, $$q_1 = -\left(S+T-\frac{b1}{3}\right)$$

$$q_2 = -\left[\frac{-1}{2}\cdot(S+T) - \frac{1}{3}\cdot b1 + \frac{1}{2}\cdot i\cdot\sqrt{3}\cdot(S-T)\right]$$

$$q_3 = -\left[\frac{-1}{2}\cdot(S+T) - \frac{1}{3}\cdot b1 - \frac{1}{2}\cdot i\cdot\sqrt{3}\cdot(S-T)\right]$$

and where, $$S = \left(RR+\sqrt{QQ^3+RR^2}\right)^{\frac{1}{3}}$$

$$T = \left(RR-\sqrt{QQ^3+RR^2}\right)^{\frac{1}{3}}$$

$$RR = \frac{9\cdot b1\cdot b2 - 27\cdot b3 - 2\cdot(b1)^3}{54}$$

$$QQ = \frac{3\cdot b2 - (b1)^2}{9}$$

and where, for the π-shape structure, $$a1 = \frac{1}{C1\cdot Z0} \quad a2 = \frac{1}{C1\cdot C2\cdot(Z0)^2} \quad a3 = \frac{1}{L\cdot C1\cdot C2\cdot Z0}$$

$$b1 = \frac{C1+C2}{C1\cdot C2\cdot Z0} \quad b2 = \frac{(C1+C2)\cdot(Z0)^2 + L}{L\cdot C1\cdot C2\cdot(Z0)^2} \quad b3 = \frac{2}{L\cdot C1\cdot C2\cdot Z0}$$

whereas for the T-shape structure:

$$a1 = \frac{Z0}{L1} \quad a2 = \frac{(Z0)^2}{L1\cdot L2} \quad a3 = \frac{Z0}{C\cdot L1\cdot L2}$$

$$b1 = \frac{(L1+L2)\cdot Z0}{L1\cdot L2} \quad b2 = \frac{L1+L2+C\cdot(Z0)^2}{C\cdot L1\cdot L2} \quad b3 = \frac{2\cdot Z0}{C\cdot L1\cdot L2}$$

and where the total signed TDR voltage-versus-time area, S, is derived and represented by:

$$S\_x = -2\cdot\Delta V\cdot\sum_{j=1}^{3}\frac{p_j}{(q_j)^2} = L\cdot\frac{\Delta V}{2\cdot Z0} - (C1+C2)\cdot\frac{\Delta V\cdot Z0}{2}$$

or $$S\_T = 2\cdot\Delta V\cdot\sum_{j=1}^{3}\frac{p_j}{(p_j)^2} = (L1+L2)\cdot\frac{\Delta V}{2\cdot Z0} - C\cdot\frac{\Delta V\cdot Z0}{2}.$$

11. A method according to claim 1 comprising, before said step of obtaining, the step of launching a step function.

12. An apparatus for extracting via parasitics comprising:
measuring means for obtaining a time domain reflectometer (TDR) waveform characterizing said via;
computing means for computing an analytic TDR waveform characterizing said via;
comparing means for comparing said measured TDR waveform and said analytic TDR waveform and for outputting a comparison result; and
extracting means for extracting via parasitics from said comparison result.

13. An apparatus according to claim 12 wherein said measuring means comprises:
a time domain reflectometer; and
a digital oscilloscope.

14. An apparatus according to claim 13 wherein said digital oscilloscope measures values selected from the group of: amplitude, rise time and time sampling step.

15. An apparatus according to claim 12 further comprising a coaxial cable used to connect a launch port of the measuring means to a board having said via.

16. An apparatus according to claim 12 further comprising means for outputting said output data as a text file including discretized time and voltages.

17. An apparatus according to claim 12 wherein said apparatus is a high-speed TDR meter.

18. A method of designing a via comprising the steps of:
a) computing, at a computing means, a first time domain reflectometer (TDR) waveform of a proposed via design, said first TDR waveform being obtained by analytical or numerical method calculation;
b) comparing, at a comparing means, said first TDR waveform with a second TDR waveform having desired characteristics for said via and outputting a comparison result;
c) verifying, from said comparison result, whether a variation between said first TDR waveform and said second TDR waveform is within or outside a defined tolerance;
d) if necessary, repeating steps a) and b) until step c) produces a variation that is within said defined tolerance; and
e) extracting via parasitics from said comparison result in order to design the via therefrom.

19. A method according to claim 18 wherein said first TDR waveform is obtained based on a set of equations characterizing said parasitics.

20. A method according to claim 19 wherein said set of equations comprises:

$$VTDR = \begin{cases} \left|\left[\mp\left(\frac{2\cdot\Delta V\cdot\pi\cdot fc}{tr}\right)\cdot\sum_{i=1}^{2}\sum_{j=1}^{3}D_{i,j}\right]\right| & \text{if } t<0 \\ \left|\left[\mp\left(\frac{2\cdot\Delta V\cdot\pi\cdot fc}{tr}\right)\cdot\sum_{i=1}^{3}\sum_{j=1}^{3}E_{i,j}\right]\right| & \text{if } 0\leq t<tr \\ \left|\left[\mp\left(\frac{2\cdot\Delta V\cdot\pi\cdot fc}{tr}\right)\cdot\sum_{i=1}^{3}\sum_{j=1}^{3}F_{i,j}\right]\right| & \text{if } tr\leq t \end{cases}$$

where "−" is employed for the π-shape structure, and "+" is employed for the T-shape structure, and the values of $D_{i,j}$, $E_{i,j}$ and $F_{i,j}$ in the equations above being defined by:

$$D_{1,j} = \frac{p_j}{(q_j)^2}\cdot e^{2\cdot\pi\cdot fc\cdot t}\cdot$$
$$\left[\frac{1}{2\cdot\pi\cdot fc}\cdot(1-e^{-2\cdot\pi\cdot fc\cdot tr}) - \frac{1}{q_j+2\cdot\pi\cdot fc}\cdot\left[1-e^{-(q_j+2\cdot\pi\cdot fc)\cdot tr}\right]\right]$$

$$D_{2,j} = \frac{p_j}{(q_j)^2}\cdot\frac{1}{q_j+2\cdot\pi\cdot fc}\cdot(1-e^{-q_j\cdot tr})\cdot e^{2\cdot\pi\cdot fc\cdot(t-tr)}$$

$$E_{1,j} = \frac{p_j}{(q_j)^2}\cdot\left[\frac{1}{2\cdot\pi\cdot fc}\cdot[1-e^{-2\cdot\pi\cdot fc\cdot(tr-t)}] - \frac{1}{q_j+2\cdot\pi\cdot fc}\cdot e^{-q_j\cdot t}\cdot\left[1-e^{-(q_j+2\cdot\pi\cdot fc)\cdot(tr-t)}\right]\right]$$

$$E_{2,j} = \frac{p_j}{(q_j)^2}\cdot\left[\frac{-1}{2\cdot\pi\cdot fc}\cdot(e^{-2\cdot\pi\cdot fc\cdot t}-1) - \frac{1}{q_j-2\cdot\pi\cdot fc}\cdot e^{-q_j\cdot t}\cdot\left[e^{(q_j-2\cdot\pi\cdot fc)\cdot t}-1\right]\right]$$

$$E_{3,j} = \frac{p_j}{(q_j)^2}\cdot\frac{1}{q_j+2\cdot\pi\cdot fc}\cdot e^{-q_j\cdot t}(e^{q_j\cdot tr}-1)e^{-(q_j+2\cdot\pi\cdot fc)\cdot(tr-t)}$$

$$F_{1,j} = \frac{p_j}{(q_j)^2}\cdot e^{-2\cdot\pi\cdot fc\cdot t}\cdot\left[\frac{-1}{2\cdot\pi\cdot fc}\cdot(1-e^{2\cdot\pi\cdot fc\cdot tr}) - \frac{1}{q_j-2\cdot\pi\cdot fc}\cdot\left[1-e^{-(q_j-2\cdot\pi\cdot fc)\cdot tr}\right]\right]$$

$$F_{2,j} = \frac{p_j}{(q_j)^2}\cdot\frac{1}{q_j+2\cdot\pi\cdot fc}\cdot e^{-q_j\cdot t}(e^{q_j\cdot tr}-1)$$

$$F_{3,j} = \frac{p_j}{(q_j)^2}\cdot\frac{1}{q_j-2\cdot\pi\cdot fc}\cdot$$
$$(e^{q_j\cdot tr}-1)\cdot\left[e^{-(q_j-2\cdot\pi\cdot fc)\cdot tr}\cdot e^{-2\cdot\pi\cdot fc\cdot t}-e^{-q_j\cdot t}\right]$$

where the values p1, p2, p3, q1, q2, q3 are functions of C1, L, C2, Z0 or L1, C, L2, Z0, which may be expressed as:

$$p_j = \left[\frac{a1\cdot(q_j)^2 - a2\cdot q_j + a3}{h}\right]\cdot d_j$$

$$d_1 = 1$$

$$d_2 = \frac{-(q_1-q_3)}{q_2-q_3}$$

$$d_3 = \frac{q_1-q_2}{q_2-q_3}$$

$$h = (q_1)^2 - q_1\cdot(q_2+q_3) + q_2\cdot q_3$$

where, $$q_1 = -\left(S+T-\frac{b1}{3}\right)$$

$$q_2 = -\left[\frac{-1}{2}\cdot(S+T) - \frac{1}{3}\cdot b1 + \frac{1}{2}\cdot i\cdot\sqrt{3}\cdot(S-T)\right]$$

$$q_3 = -\left[\frac{-1}{2}\cdot(S+T) - \frac{1}{3}\cdot b1 - \frac{1}{2}\cdot i\cdot\sqrt{3}\cdot(S-T)\right]$$

and where, $$S = \left(RR + \sqrt{QQ^3+RR^2}\right)^{\frac{1}{3}}$$

$$T = \left(RR - \sqrt{QQ^3+RR^2}\right)^{\frac{1}{3}}$$

$$RR = \frac{9\cdot b1\cdot b2 - 27\cdot b3 - 2\cdot(b1)^3}{54}$$

$$QQ = \frac{3\cdot b2 - (b1)^2}{9}$$

and where, for the π-shape structure, $$a1 = \frac{1}{C1\cdot Z0} \quad a2 = \frac{1}{C1\cdot C2\cdot(Z0)^2} \quad a3 = \frac{1}{L\cdot C1\cdot C2\cdot Z0}$$

$$b1 = \frac{C1+C2}{C1\cdot C2\cdot Z0} \quad b2 = \frac{(C1+C2)\cdot(Z0)^2 + L}{L\cdot C1\cdot C2\cdot(Z0)^2} \quad b3 = \frac{2}{L\cdot C1\cdot C2\cdot Z0}$$

whereas for the T-shape structure:

$$a1 = \frac{Z0}{L1} \quad a2 = \frac{(Z0)^2}{L1\cdot L2} \quad a3 = \frac{Z0}{C\cdot L1\cdot L2}$$

$$b1 = \frac{(L1+L2)\cdot Z0}{L1\cdot L2} \quad b2 = \frac{L1+L2+C\cdot(Z0)^2}{C\cdot L1\cdot L2} \quad b3 = \frac{2\cdot Z0}{C\cdot L1\cdot L2}$$

and where the total signed TDR voltage-versus-time area, S, is derived and represented by:

$$S\_x = -2\cdot\Delta V\cdot\sum_{j=1}^{3}\frac{p_j}{(q_j)^2} = L\cdot\frac{\Delta V}{2\cdot Z0} - (C1+C2)\cdot\frac{\Delta V\cdot Z0}{2}$$

or $$S\_T = 2\cdot\Delta V\cdot\sum_{j=1}^{3}\frac{p_j}{(p_j)^2} = (L1+L2)\cdot\frac{\Delta V}{2\cdot Z0} - C\cdot\frac{\Delta V\cdot Z0}{2}.$$

* * * * *